(12) United States Patent  (10) Patent No.: US 9,170,769 B2
Mirchandani et al.  (45) Date of Patent: Oct. 27, 2015

(54) CROSSTALK MITIGATION IN ON-CHIP INTERFACES

(71) Applicant: Broadcom Corporation, Irvine, CA (US)

(72) Inventors: Sandeep Mirchandani, Palo Alto, CA (US); Chakrapal Kalwa, Sunnyvale, CA (US); Chi-Jung Peng, Cupertino, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/027,068

(22) Filed: Sep. 13, 2013

(65) Prior Publication Data

US 2014/0215104 A1  Jul. 31, 2014

Related U.S. Application Data

(60) Provisional application No. 61/757,947, filed on Jan. 29, 2013.

(51) Int. Cl.
    *G06F 3/00*  (2006.01)
    *G06F 5/16*  (2006.01)
    *G06F 1/26*  (2006.01)
    *G06F 1/32*  (2006.01)
    *H03K 19/096*  (2006.01)
    *G06F 1/00*  (2006.01)
    *G06F 1/10*  (2006.01)

(52) U.S. Cl.
    CPC .. *G06F 5/16* (2013.01); *G06F 1/00* (2013.01); *G06F 1/10* (2013.01); *G06F 1/266* (2013.01); *G06F 1/3287* (2013.01); *H03K 19/096* (2013.01)

(58) Field of Classification Search
    CPC ............ G06F 5/06; G06F 5/16; G06F 5/065; G06F 9/544
    USPC .................... 710/51, 53, 56, 57, 58
    See application file for complete search history.

(56) References Cited

U.S. PATENT DOCUMENTS

| 5,313,582 | A * | 5/1994 | Hendel et al. ............ 710/56 |
| 5,659,690 | A * | 8/1997 | Stuber et al. ............ 710/307 |
| 6,701,390 | B2 * | 3/2004 | Ehmann ................. 710/33 |
| 7,254,677 | B1 * | 8/2007 | Lowe et al. ............ 711/118 |
| 2003/0164836 | A1 * | 9/2003 | Tang et al. ............ 345/558 |
| 2004/0111592 | A1 * | 6/2004 | Nagao et al. ............ 712/235 |
| 2007/0288731 | A1 * | 12/2007 | Bradford et al. ......... 712/235 |
| 2009/0013116 | A1 * | 1/2009 | Svanell et al. ........... 710/118 |

* cited by examiner

*Primary Examiner* — Idriss N Alrobaye
*Assistant Examiner* — Getente A Yimer
(74) *Attorney, Agent, or Firm* — Sterne, Kessler, Goldstein & Fox PLLC

(57) ABSTRACT

A system and method to reduce and/or eliminate crosstalk between various data paths of a data bus within integrated circuits (i.e., chips). The system and method can transmit both delayed and non-delayed data in respective transmission paths, store the delayed and non-delayed data upon receipt, and delay the reading of the delayed and non-delayed data from the storage unit to compensate for the delay implemented on the transmission of the delayed data.

20 Claims, 9 Drawing Sheets

US 9,170,769 B2

CROSSTALK MITIGATION IN ON-CHIP INTERFACES

CROSS REFERENCE TO RELATED APPLICATIONS

This patent application claims the benefit of U.S. Provisional Patent Application No. 61/757,947, filed Jan. 29, 2013, entitled "POWER MANAGEMENT ON A BASEBAND CHIP," which is incorporated herein by reference in its entirety.

FIELD

This application relates generally to integrated circuits, and more particularly to the transmission of data between on-chip components.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The embodiments of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

For purposes of this discussion, the term "module" shall be understood to include one of software, or firmware, or hardware (such as circuits, microchips, processors, or devices, or any combination thereof), or any combination thereof. In addition, it will be understood that each module can include one, or more than one, component within an actual device, and each component that forms a part of the described module can function either cooperatively or independently of any other component forming a part of the module. Conversely, multiple modules described herein can represent a single component within an actual device. Further, components within a module can be in a single device or distributed among multiple devices in a wired or wireless manner.

Figure 1:
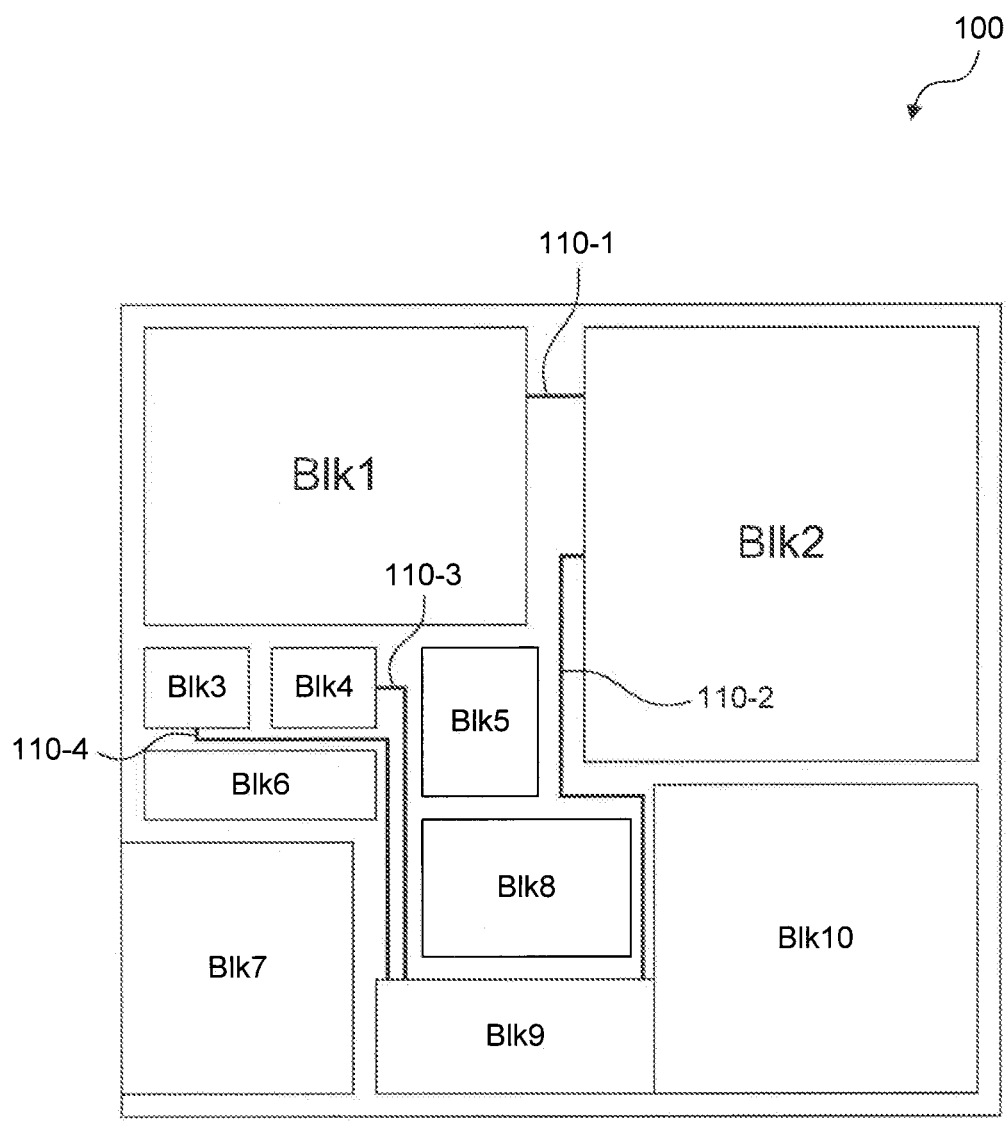
FIG. 1 illustrates a conventional integrated circuit.

FIG. 1 illustrates a conventional integrated circuit 100. The integrated circuit 100 includes multiple components referred to as blocks (e.g., Blk1, Blk2, etc.) that each include suitable logic, circuitry, and/or code that is configured to perform one or more arithmetical, logical, and/or input/output operations, and/or to store information such as executable instructions and data. Data is communicated between two or more of the blocks utilizing an on-chip interconnection network, including one or more data buses 110-1 to 110-N connected between the various blocks. The one or more data buses 110 can include one or more parallel buses configured to transmit data in parallel on multiple transmission paths, and/or one or more serial busses configured to transmit data in bit-serial form via a transmission path to provide some examples. The transmission paths can include, for example, metallic wires and/or optical fibers to provide some examples. It will also be appreciated to those skilled in the relevant arts that the data buses 110 can be wired, wireless, or a combination of both wired and wireless implementations to provide some examples. The transmission paths can also include a plurality of buffers positioned along each of the transmission paths.

Figure 2:
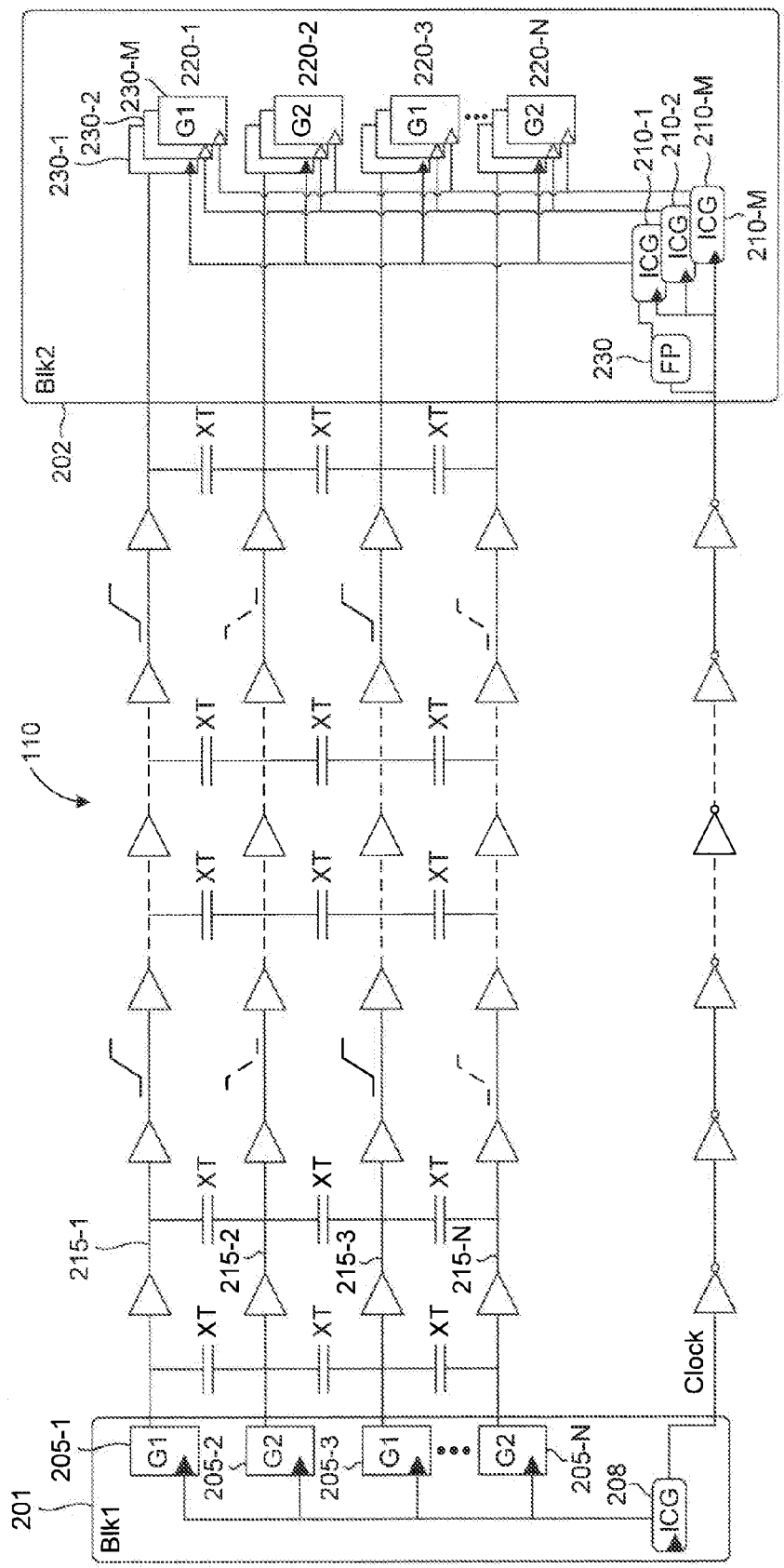
FIG. 2 illustrates a conventional integrated circuit.

FIG. 2 illustrates a conventional integrated circuit 200. Here, the on-chip interconnection between a first block 201 and a second block 202 (e.g., Blk 1 and Blk 2) includes a data bus 110 configured as a parallel data bus. The first block 201 includes a plurality of flip-flops 205-1 to 205-N, where N is an even number, and an integrated clock gate (ICG) 208 that includes suitable logic, circuitry, and/or code that is configured to provide an input clock to each of the flip-flops 205 and to the second block 202 (e.g., to FIFO pointer module 230 and integrated clock gates 208 of the second block 202). The input clock can be provided to the second block 202 via the data bus 110. Alternatively, the input clock can be provided to the second block 202 via a signal path independent from data bus 110.

The flip-flops 205 each include suitable logic, circuitry, and/or code that is configured to store state information and to provide the information to one or more other blocks of the integrated circuit 200 via one or more data buses 110. Here, the flips-flops 205 provide the information to the second block 202 via the parallel data bus 110. For the purposes of this disclosure, the transmission of data between the first block 201 and the second block 202 via the parallel data bus 110 is described as data being transmitted from the first block 201 to the second block 202. However, it will be appreciated by those skilled in the relevant arts that the blocks of the integrated circuit can be configured to transmit to, and receive data from, the one or more other blocks of the integrated circuit 200.

The second block 202 includes a plurality of First in, First out (FIFO) buffers 220-1 to 220-N that are configured to communicate with flip-flops 205-1 to 205-N via respective transmission paths 215-1 to 215-N. Each of the FIFO buffers 220 can include a bank of a plurality of flip-flops 230-1 to 230-M each including suitable logic, circuitry, and/or code that is configured to store data in the form of state information. Here, each of the FIFO buffers 220 can include, for example, three flip-flops 230. The second block 202 also includes a respective number of integrated clock gates (ICG) 210-1 to 210-M that each include suitable logic, circuitry, and/or code that is configured to provide an input clock to the respective flip-flops 230-1 to 230-M of each of the FIFO buffers 220 based on the input clock from ICG 208 of the first block 201.

The second block 202 includes a FIFO pointer module 230 that includes suitable logic, circuitry, and/or code that is configured to control the integrated clock gates 210-1 to 210-M, which in turn control the operation of the flip-flops 230 of the FIFO buffers 220. For example, the FIFO pointer module 230 can control the integrated clock gates 210-1 to 210-M to enable which of the flip-flops 230-1 to 230-M are to store data that has been transmitted to the second block 202 via the respective transmission paths 215. That is, the FIFO pointer module 230 ensures that only a single flip-flop 230 of each of the FIFO buffers 220 (e.g., only a single column of the flip-flops 230 shown in FIG. 2) is written to in any clock cycle. In operation, the FIFO pointer module 230 provides the integrated clock gates 210 with an enable (en) signal that selectively activates one of the integrated clock gates 210-1 to 210-M to provide an input clock signal to a corresponding one of the flip-flops 230-1 to 230-M in the various FIFO buffers 220. The data received via the transmission paths 215 are then written to the corresponding flip-flops 230 of the FIFO buffers 220. On the next clock cycle, the FIFO pointer module 230 incrementally enables the next one of the integrated clock gates 210-1 to 210-M. Following the clock cycle in which the last integrated clock gate 210-M was enabled, the FIFO pointer module 230 returns to the first integrated clock gate 210-1 so as to enable the writing of the received data to the corresponding flip-flops 210-1 of the FIFO buffers 220.

In utilizing the parallel data buses 110 having parallel transmission paths 215, the simultaneous transmission of data along the transmission paths 215 can result in crosstalk XT between adjacent transmission paths 215 and/or between non-adjacent transmissions paths 215 that are in close proximity to one or more other transmission paths 215. Crosstalk occurs when energy on one transmission path induces voltages and/or currents on one or more neighboring (e.g., adjacent or in close proximity) transmission paths through capacitive and/or inductive coupling. The simultaneous transmission of data can also result in simultaneous switching of components of the integrated circuit 200, including components (e.g., buffers) implemented in the data buses along the various transmission paths 215. The simultaneous switching results in increased power consumption because multiple components of the integrated circuits are operating at the time.

Figure 3:
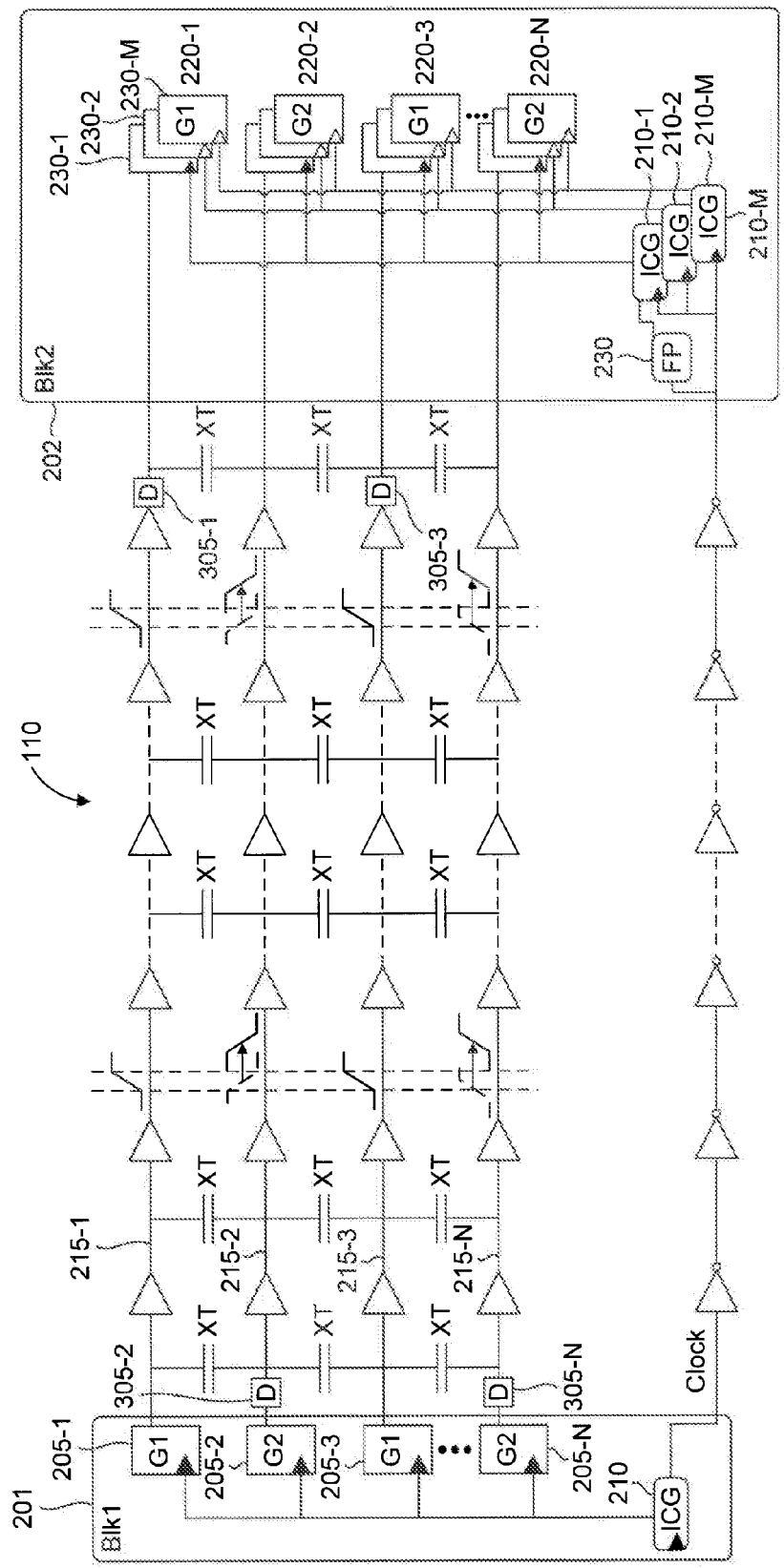
FIG. 3 illustrates a conventional integrated circuit.

FIG. 3 illustrates a conventional integrated circuit 300. The integrated circuit 300 shares many common elements and features with the integrated circuit 200 described with reference to FIG. 2. For example, the integrated circuit 300 includes first and second blocks 201 and 202 connected via the data bus 110. The first block 201 includes flip-flops 205-1 to 205-N respectively connected to FIFO buffers 220-1 to 220-N of the second block 202 via respective transmission paths 215-1 to 215-N of the data bus 110. These common elements and features, among others, are not repeated here for brevity, and only differences between the integrated circuit 300 and the integrated circuit 200 are to be discussed in further detail below.

The integrated circuit 300 also includes a delay module 305 included in each of the transmission paths 215. The delay module 305 includes suitable logic, circuitry, and/or code that is configured to delay the transmission of data through a corresponding transmission path. For example, the delay module 305 may include one or more buffers (e.g. amplifiers with unit gain) configured to receive a data signal and output a delayed data signal. In an exemplary embodiment, the delay modules 305-1 to 305-N are configured to introduce equal or substantially equal delay in each of the transmission paths 215. However, as is will be understood by those skilled in the relevant arts, one or more of the delay modules 305 can be configured to have a different delay with respect to one or more other delay modules 305 such that the corresponding data signals arriving at different times. In this case, the second block 202 can be configured to account for the various delays by adjusting the write cycles of the FIFO buffers 220-1 to 220-N.

Adjacent transmission paths 215 can be configured to have alternately placed delay modules 305 so that each pair of adjacent transmission paths 215 includes one transmission path 215 with a delay module 305 located substantially proximate to the first block 201 and the other transmission path 215 with a delay module 305 located substantially proximate to the second block 202. For example, as illustrated in FIG. 3, transmission path 215-1 includes delay module 305-1 located substantially proximate to the junction of the transmission path 215-1 and the second block 202. The adjacent transmission path 215-2 includes delay module 305-2 located substantially proximate to the junction of the transmission path 215-2 and the first block 201.

In operation, the delay module 305-1 is configured to delay the data signals transmitted along the transmission path 215-1 from the first block 201 just prior to the data signals reaching their destination at the second block 202. Conversely, the delay module 305-2 is configured to delay the data signal transmitted along the transmission path 215-2 from the first block 201 just after the data signal has been pushed to the transmission path 215-2 by the flip-flop 205-2 of the first block 201. That is, the data signal traveling along the transmission path 215-1 is a non-delayed data signal until just before the data signal is to arrive at the second block 202 at which point it is delayed by the delay module 205-1. Conversely, the data signal traveling along the transmission path 215-2 is a delayed data signal as it is delayed by the delay module 305-2 just after being outputted by the first block 201. More specifically, although the corresponding adjacent flip-flops 205-1 and 205-2 output their respective data signals simultaneously, the data signals are not simultaneously being transmitted (e.g., adjacently travelling) along the transmission paths 215-1 and 215-2, respectively, because the data signal traveling along the transmission path 215-2 is delayed by delay module 305-2. To compensate for this delay, the data signal transmitted along transmission path 215-1 is delayed on the backend (e.g., just before arriving at the second block 202) so that the two data signals arrive at the second block 202 simultaneously. As a result, the integrated circuit 300 reduces and/or eliminates cross talk XT between the adjacent transmission paths 215 (e.g., transmission paths 215-1 and 215-2) by staggering the travel of the data signals along respective transmission paths 215 while maintaining simultaneous or substantially simultaneous reception of the data signals by the corresponding block (e.g., second block 202).

In an exemplary embodiment, the various transmission paths 215 of the data bus 110 are fabricated using one or more well-known semiconductor implantation processes (e.g., lithography) that form adjacent transmission paths in independent implantation steps. For example, transmission paths 215-1, 215-3, etc. are formed by a first implantation process and transmission paths 215-2, 215-4, etc. are formed by a second implantation process following the first implantation process. This multi-step fabrication process can be referred to as double patterning. In double patterning, the various groups of wires can be are treated as being "colored" differently to differentiate them for modeling and manufacturing purposes. As a consequence of the multistep process, transmission paths 215 formed in the first process can exhibit different properties, including different electrical and/or thermal properties to provide some examples with respect to the transmission paths 215 formed in the subsequent process. Ideally, the delay introduced by delay modules 305-1 to 305-N should be same, but due to temperature, voltage, and/or process variations including the double patterning, the introduced delays of the various delay modules 305 can differ. As a result, the different properties and/or variations will influence the timing of data and clock signals traveling along the transmission paths 215 and/or clock signal paths. As will be discussed in reference to FIG. 4, the integrated circuits described in the exemplary embodiments of this disclosure can be configured to neutralize or even utilize the timing offsets introduced by the double patterning manufacturing process of the transmission paths 215 to reduce and/or eliminate cross talk influences between the transmission paths 215.

Figure 4:
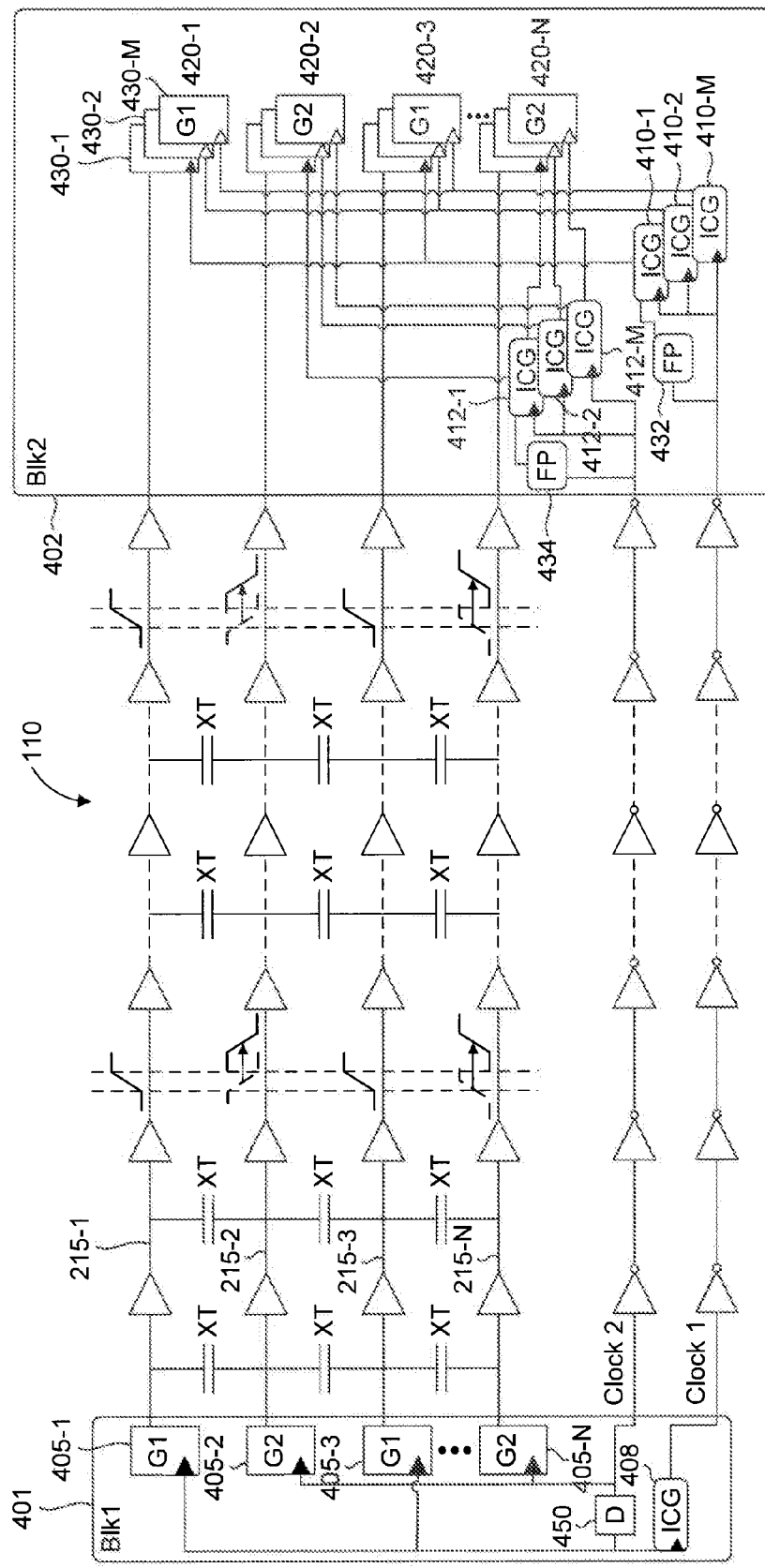
FIG. 4 illustrates an integrated circuit in accordance with an exemplary embodiment of the present disclosure.

FIG. 4 illustrates the integrated circuit 400 in accordance with an exemplary embodiment of the present disclosure. The integrated circuit 400 shares many common elements and features with the integrated circuit 200 described with reference to FIG. 2 and integrated circuit 300 described with reference to FIG. 3. Common elements and features, among others, are not repeated here for brevity.

The integrated circuit 400 includes a first block 401 communicatively coupled to a second block 402 via data bus 110. First block 401 is similar to first block 201 of FIG. 2 and includes a plurality of flip-flops 405-1 to 405-N that are similar to flip-flops 205-1 to 205-N, where N is an even number, an integrated clock gate (ICG) 408 and a (clock) delay module 405. The integrated clock gate 408 includes suitable logic, circuitry, and/or code that is configured to provide an input clock to the flip-flops 405, and to the second block 402 (e.g. Clock 1). In an exemplary embodiment, the input clock (Clock 1) can be provided to the second block 402 via a transmission path 215 of the data bus 110. Alternatively, the input clock can be provided to the second block 402 via a signal path independent from data bus 110.

The delay module 450 includes suitable logic, circuitry, and/or code that is configured to delay the clock signal generated by the integrated clock gate 408. The delay module 450 is configured to provide a delayed clock signal to half of the flip-flops 405 and to the second block 402 (e.g., Clock 2). In an exemplary embodiment, the delayed clock signal (Clock 2) can be provided to the second block 402 via a transmission path 215 of the data bus 110. Here, the non-delayed clock signal (Clock 1) and the delayed clock signal (Clock 2) are transmitted via different transmission paths 215. Alternatively, the delayed clock signal can be provided to the second block 402 via a signal path independent from data bus 110 and the non-delayed clock signal (Clock 1) can be provided via another independent signal path different from the signal path used to transmit the delayed signal clock (Clock 2).

he flip-flops 405-1 to 405-N can be divided into two groups (e.g., G1 and G2), where the non-delayed clock signal from the ICG 408 is provided to the odd flip-flops 405 (e.g., 405-1, 405-3, etc.) and the delayed clock generated by the delay module 450 is provided to the even flip-flops 405 (e.g., 405-2, 405-4, etc.). In operation, the flip-flops 405 of the first group (e.g. G1) are configured to output their respective data signals to respective transmission paths 215 based on the clock signal provided by the ICG 408. Similarly, the flip-flops 405 of the second group (e.g. G2) are configured to output their respective data signals to respective transmission paths 215 based on the delayed clock signal provided by the delay module 450. Based on this configuration, the data signal traveling along a transmission path 215 (e.g., transmission path 215-1) is staggered with respect to the data signal traveling along an adjacent transmission path 215 (e.g., transmission path 215-2) due to the alternating of the clock signal (direct from the ICG 408) and the delayed clock signal (from the delay module 450) with respect to adjacent transmission paths 215. Consequently, cross talk XT between adjacent transmission paths 215 is reduced and/or eliminated. Further, because of the staggered transmission, the number of components within the transmission paths 215 and the blocks 401 and 402 that are simultaneous switching is reduced, thereby reducing the momentary power consumption at any given time. That is, fewer components are operating at the same time (e.g., their operations are staggered by the delayed clock), which reduces any momentary spike in power consumption within the integrated circuit.

In addition, as will be appreciated by those skilled in the relevant arts, effects of the process and/or voltage variations between the two groups will not impact the data eye diagrams. Delay elements can be especially sensitive to process-voltage-temperature variations, and these variations are reduced and/or canceled out between launch and capture paths. Also, in exemplary embodiments in which double-patterning is implemented, the first group of transmission paths 215 and the non-delayed clock path are manufactured using a first implantation process, and the second group of transmission paths 215 and the delayed clock path will be manufactured using a second implantation process, thereby rendering any variation associated with each group and their associated clock, and/or any variations between the two groups inconsequential.

Accordingly, as will be appreciated by those skilled in the relevant arts, the integrated circuits described in the exemplary embodiments of this disclosure can be configured to utilize the timing offsets introduced by the double patterning manufacturing process of the transmission paths 215 to reduce and/or eliminate cross talk influences between the transmission paths 215. For example, by dividing the transmission paths 215 into two groups (e.g., even and odd paths, where the even are formed in the first process and the odd in the second process) as discussed above, the timing variations between the differently formed transmission paths 215 (as well as correspond clock signal paths) is rendered inconsequential by the delayed clock introduced in only one of the two groups of the transmission paths 215. Therefore, any timing variation introduced between the two groups by the double patterning can be compensated for within the delay introduced to the clock associated with those transmission paths. Here, the delay introduced by the delay module 450 is typically larger with respect to any delay resulting from processing variations. Accordingly, the processing variations and any associated delays are rendered somewhat inconsequential, and do not need to be addressed.

The second block 402 includes a plurality of First in, First out (FIFO) buffers 420-1 to 420-N that are configured to communicate with flip-flops 405-1 to 405-N via respective transmission paths 215-1 to 215-N. Similar to the FIFO buffers 220 of FIG. 2, each of the FIFO buffers 420 can include a bank of a plurality of flip-flops 430-1 to 430-M each including suitable logic, circuitry, and/or code that is configured to store state information. Here, each of the FIFO buffers 420 can include, for example, three flip-flops 430.

The second block 402 also includes a respective number of integrated clock gates (ICG) 410-1 to 410-M that are similar to the ICGs 210 of FIG. 2. The block of ICGs 410-1 to 410-M are paired with a FIFO pointer module 432 that is similar to the FIFO pointer module 230 of FIG. 2, and that includes suitable logic, circuitry, and/or code that is configured to control the integrated clock gates 410-1 to 410-M, which in turn control the operation of the flip-flops 430. The ICGs 410 and FIFO pointer module 432 are driven by the clock signal (Clock 1) from ICG 408 of the first block 401. The second block 402 also includes a second set of ICGs 412-1 to 412-M and a corresponding FIFO pointer module 434. Here, the second set of ICGs 412 and second FIFO pointer module 434 are cloned versions of the ICGs 410 and FIFO pointer module 432, respectively (i.e., the clock versions are configured so as to similarly operate). The ICGs 412 and FIFO pointer module 434 are driven by the delayed clock signal (Clock 2) from the delay module 450 of the first block 401. In an exemplary embodiment, FIFO pointer module 432 and/or FIFO pointer module 434 implement grey code logic and are configured to perform binary-to-grey code conversion.

In an exemplary embodiment, similar to the flip-flops 405 of the first block 401, the FIFO buffers 420 are divided into two groups (e.g., G1 and G2) that correspond to the two groups (e.g., G1 and G2) of flip-flops 405. For example, the FIFO buffers 420 can be divided into a first group representing the odd FIFO buffers 420 (e.g., FIFO buffers 420-1, 420-3, etc.) and a second group representing the even FIFO buffers 420 (e.g., FIFO buffers 420-2, 420-4, etc.). In this configuration, the ICGs 410 and FIFO pointer module 432 can be configured to control the operation of the odd FIFO buffers 420 (e.g., FIFO buffers 420-1, 420-3, etc.) and the ICGs 412 and FIFO pointer module 434 can be configured to control the even FIFO buffers 420 (e.g., FIFO buffers 420-2, 420-4, etc.). As a result, the even FIFO buffers 420 (e.g., FIFO buffers 420-2, 420-4, etc.) are operating off of the delayed clock (Clock 2) and the odd FIFO buffers 420 (e.g., FIFO buffers 420-1, 420-3, etc.) are operating off of the clock signal (Clock 1).

In operation, the FIFO pointer module 432 provides the integrated clock gates 410 with an enable (en) signal that selectively activates one of the integrated clock gates 410-1 to 410-M to provide an input clock signal to a corresponding one of the flip-flops 430-1 to 430-M in the odd FIFO buffers 420 (e.g., FIFO buffers 420-1, 420-3, etc.). Here, the data received via the transmission paths 215 (e.g., transmission paths 215-1, 215-2, etc.) are then written to the corresponding flip-flops 430 of the odd FIFO buffers 420 (e.g., FIFO buffers 420-1, 420-3, etc.). On the next clock cycle, the FIFO pointer module 432 incrementally enables the next one of the integrated clock gates 410-1 to 410-M.

Following the clock cycle in which the last integrated clock gate 410-M was enabled, the FIFO pointer module 432 returns to the first integrated clock gate 410-1 so as to enable the writing of the received data to the corresponding flip-flops 430-1 of the odd FIFO buffers 420 (e.g., FIFO buffers 420-1, 420-3, etc.).

Similarly, the FIFO pointer module 434 provides the integrated clock gates 412 with an enable (en) signal that selectively activates one of the integrated clock gates 412-1 to 412-M to provide an input clock signal to a corresponding one of the flip-flops 430-1 to 430-M in the even FIFO buffers 420 (e.g., FIFO buffers 420-2, 420-4, etc.). The data received via the transmission paths 215 (e.g., transmission paths 215-2, 215-4, etc.) are then written to the corresponding flip-flops 430 of the even FIFO buffers 420 (e.g., FIFO buffers 420-2, 420-4, etc.). On the next clock cycle, the FIFO pointer module 434 incrementally enables the next one of the integrated clock gates 410-1 to 410-M. Following the clock cycle in which the last integrated clock gate 410-M was enabled, the FIFO pointer module 434 returns to the first integrated clock gate 412-1 so as to enable the writing of the received data to the corresponding flip-flops 430-1 of the even FIFO buffers 420 (e.g., FIFO buffers 420-2, 420-4, etc.).

Figure 5:
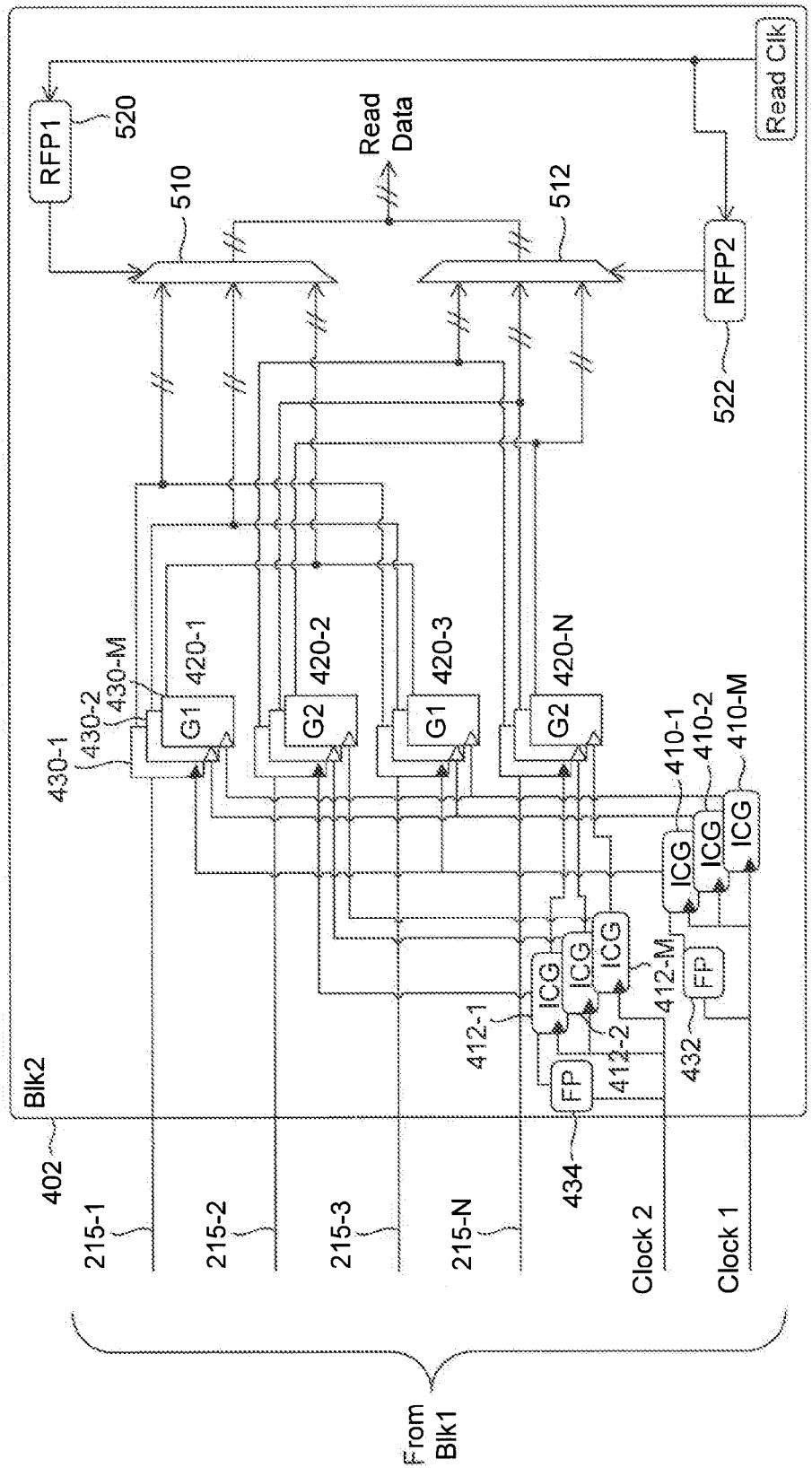
FIG. 5 illustrates an integrated circuit in accordance with an exemplary embodiment of the present disclosure.

FIG. 5 illustrates the second block 402 in accordance with an exemplary embodiment of the present disclosure. The second block 402 shares many common elements and features with the integrated circuit 400 described with reference to FIG. 4. The common elements and features, among others, are not repeated here for brevity.

In an exemplary embodiment, the second block 402 includes a first multiplexer 510 coupled to the outputs of odd FIFO buffers 420 (e.g., FIFO buffers 420-1, 420-3, etc.) and a second multiplexer 512 coupled to the outputs of the even FIFO buffers 420 (e.g., FIFO buffers 420-2, 420-4, etc.). The second block 402 also includes first and second read FIFO pointer modules 520 and 522 that operate off a clock signal generated by a read clock 530. In an exemplary embodiment, FIFO pointer module 520 and/or FIFO pointer module 522 implement grey code logic and are configured to perform binary-to-grey code conversion.

The first multiplexer 510 includes suitable logic, circuitry, and/or code that is configured to multiplex the outputs of the odd FIFO buffers 420 (e.g., FIFO buffers 420-1, 420-3, etc.) based on a control signal generated by the first read FIFO pointer module 520. In particular, the first multiplexer 510 receives the outputs from the odd FIFO buffers 420 and selects between the flip-flops 430-1 to 430-M based on the control signal from the first read FIFO pointer module 520. For example, the first multiplexer 510 is configured to receive three inputs: (1) the output of flip-flops 430-1 from FIFO buffers 420-1 and 420-3; (2) the output of flip-flops 430-2 from FIFO buffers 420-1 and 420-3; and (3) the output of flip-flops 430-3 from FIFO buffers 420-1 and 420-3. Here, the output from each pair of FIFO buffers 420 is combined prior to being input to the first multiplexer 510. That is, the 1-bit output of the individual flip-flops 430 for each pair of flip-flops 430 is combined to form a 2-bit output and provided to a corresponding input of the multiplexer 510 via a 2-bit bus. The multiplexer 510 is then configured to selectively output the received 2-bit data from the various pairs of flip-flops 430 via a 2-bit bus.

Similarly, the second multiplexer 512 includes suitable logic, circuitry, and/or code that is configured to multiplex the outputs of the even FIFO buffers 420 (e.g., FIFO buffers 420-2, 420-4, etc.) based on a control signal generated by the second read FIFO pointer module 522. In particular, the second multiplexer 512 receives the outputs from the eve FIFO buffers 420 and selects between the flip-flops 430-1 to 430-M based on the control signal from the first read FIFO pointer module 522. For example, the second multiplexer 512 is configured to receive three inputs: (1) the output of flip-flops 430-1 from FIFO buffers 420-2 and 420-4; (2) the output of flip-flops 430-2 from FIFO buffers 420-2 and 420-4; and (3) the output of flip-flops 430-3 from FIFO buffers 420-2 and 420-4. Here, the output from each pair of FIFO buffers 420 is combined prior to being input to the second multiplexer 512. Similar to the operation of the first multiplexer 510, the 1-bit output of the individual flip-flops 430 for each pair of flip-flops 430 is combined to form a 2-bit output and provided to a corresponding input of the multiplexer 510 via a 2-bit bus. The multiplexer 512 is then configured to selectively output the received 2-bit data from the various pairs of flip-flops 430 via a 2-bit bus. Here, the 2-bit output of the multiplexer 512 is combined with the 2-bit output of the multiplexer 510 to form a 4-bit output and provided as read data via a 4-bit bus.

The first and second read FIFO pointer modules 520 and 522 include suitable logic, circuitry, and/or code that is configured to generate control signals to control the first and second multiplexers 510 and 512, respectively. The first and second read FIFO pointer modules 520 and 522 are configured to operate off of a clock signal generated by read clock module 530. In an exemplary embodiment, as discussed in more detail below with reference to FIGS. 7 and 8, the first and second read FIFO pointer modules 520 and 522 are configured to synchronize with each other. For example, the first and second read FIFO pointer modules 520 and 522 are configured to exchange their respective control signals with the other read FIFO pointer module (not shown in FIG. 5 but illustrated in FIG. 8) so that the first and second read FIFO pointer modules 520 and 522 synchronously advance the first and second multiplexers 510 and 512, respectively.

The first and second read FIFO pointer modules 520 and 522 are also configured to monitor the FIFO pointer module 432 and the FIFO pointer module 434 to align the read cycles of the read FIFO pointer modules 520, 522 with the FIFO pointer modules 432, 434. By aligning the read and write cycles, the read FIFO pointer modules 520, 522 ensure that the corresponding read cycles occur after data has been written into corresponding flip-flops 430 by the write cycles controlled by the FIFO pointer modules 432, 434. In an exemplary embodiment, the first and second read FIFO pointer modules 520 and 522 are configured to operate at a two cycle offset of the FIFO pointer modules 432, 434. For example, data is read from the first column of the flip-flops 430-1 during the cycle in which data is written to the third column of flip-flops 430-3, and so on. This ensures that the data has completely been written to the flip-flops 430 before it is read from such flip-flops 430 while compensating for the delays introduced into the transmission paths 215 by the delay module 450. An exemplary write/read sequence is shown in the following table.

| Cycle | Data Written | Data Read |
| --- | --- | --- |
| 1 | flip-flops 430-1 of FIFO buffers 420-1, 420-3 | — |
| 1 (delay) | flip-flops 430-1 of FIFO buffers 420-2, 420-4 | |
| 2 | flip-flops 430-2 of FIFO buffers 420-1, 420-3 | — |
| 2 (delay) | flip-flops 430-2 of FIFO buffers 420-2, 420-4 | |
| 3 | flip-flops 430-3 of FIFO buffers 420-1, 420-3 | flip-flops 430-1 of FIFO |
| 3 (delay) | flip-flops 430-3 of FIFO buffers 420-2, 420-4 | buffers 420-1 to 420-4 |
| 4 | flip-flops 430-1 of FIFO buffers 420-1, 420-3 | flip-flops 430-2 of FIFO |
| 4 (delay) | flip-flops 430-1 of FIFO buffers 420-2, 420-4 | buffers 420-1 to 420-4 |
| 5 | flip-flops 430-2 of FIFO buffers 420-1, 420-3 | flip-flops 430-3 of FIFO |
| 5 (delay) | flip-flops 430-2 of FIFO buffers 420-2, 420-4 | buffers 420-1 to 420-4 |
| 6 | flip-flops 430-3 of FIFO buffers 420-1, 420-3 | flip-flops 430-1 of FIFO |
| 6 (delay) | flip-flops 430-3 of FIFO buffers 420-2, 420-4 | buffers 420-1 to 420-4 |

Figure 6:
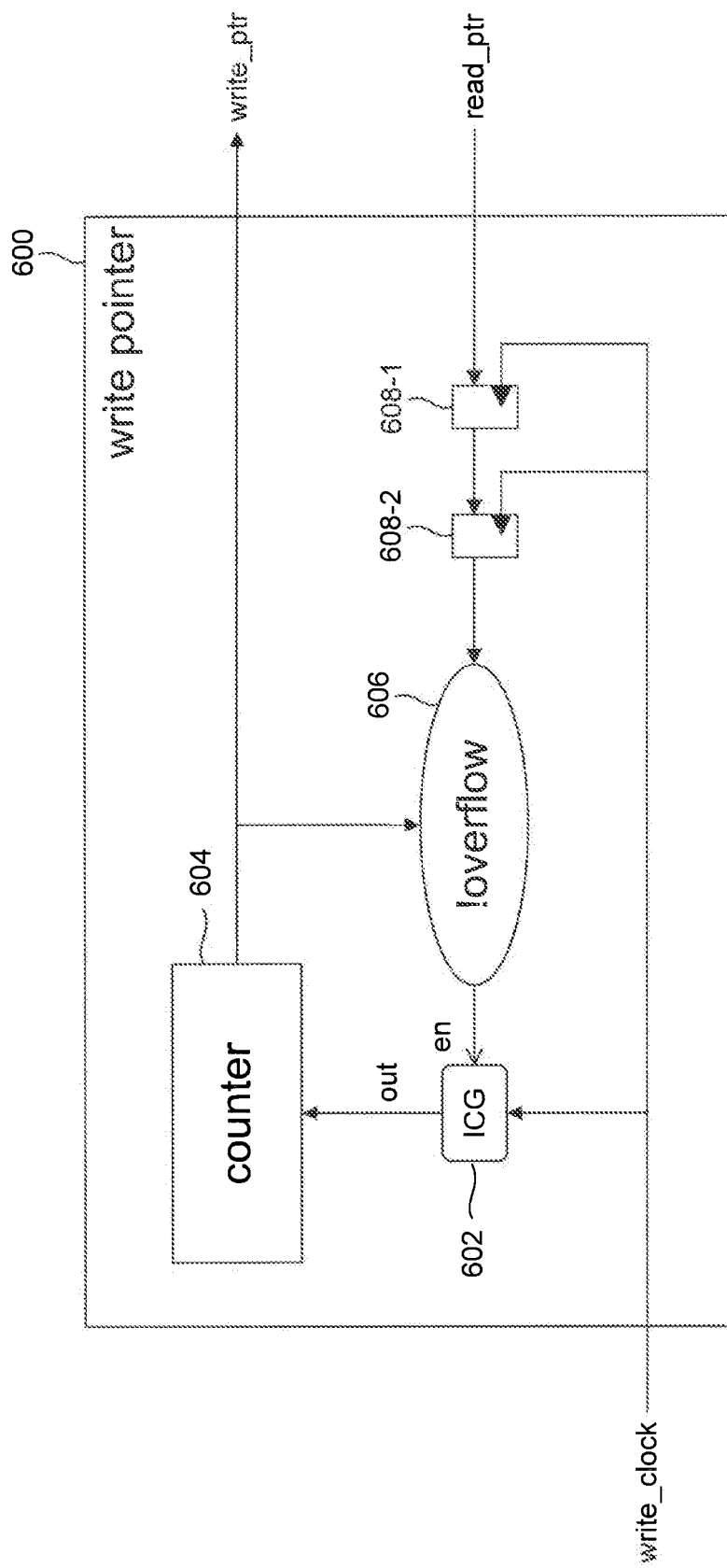
FIG. 6 illustrates a write pointer module in accordance with an exemplary embodiment of the present disclosure.

FIG. 6 illustrates a FIFO pointer module 600 in accordance with an exemplary embodiment of the present disclosure. The FIFO pointer module 600 can be implemented in one or more of the exemplary embodiments described herein. The FIFO pointer module 600 can be representative of FIFO pointer module 230, 432, and/or 434 to provide some examples. The FIFO pointer module 600 includes an integrated clock gate (ICG) 602, counter 604, overflow module 606 and flip-flops 608-1 and 608-2. In an exemplary embodiment, FIFO pointer module 600 implements grey code logic and are configured to perform binary-to-grey code conversion.

The integrated clock gate (ICG) 602 includes suitable logic, circuitry, and/or code that is configured to provide an input clock to the counter 604 based on an enable signal generated by the overflow module 606 and a clock signal received from another block (e.g., first block 401). For example, the ICG 602 can be configured to generate the input clock signal based on the clock signal (e.g., Clock 1) and/or delayed clock signal (e.g., Clock 2) received from the first block 401.

The counter 604 includes suitable logic, circuitry, and/or code that is configured to increment a counter value based on the input clock signal (e.g., write_clock) from the ICG 602 (e.g., the counter value is incremented once for every clock cycle). The counter 604 is configured to output the incremented value as a write enable signal (e.g., write_ptr) which controls the writing of data to the flip-flops 430. For example, the incremented value can be outputted as the enable signal that selectively activates one of the integrated clock gates 410 and/or 412 as illustrated in FIG. 4.

The overflow module 606 includes suitable logic, circuitry, and/or code that is configured to determine an overflow condition based on one or more input values. For example, the overflow module 606 can determine an overflow condition based on the write enable signal generated by the counter 604 and the output value of the flip-flop 608-2. In an exemplary embodiment, the overflow module 606 is configured to output an enable signal when a "not overflow" condition (e.g., !overflow) is active. The overflow condition is active when the output value of the counter 604 is greater than the output from the flip-flop 608-2. Therefore, the overflow module 606 configured to indicate a "not overflow" condition when the overflow module 606 determines that the output value of the counter 604 is not greater than the output of the flip-flop 608-2.

The flip-flops 608-1 and 608-2 are configured in series, where the first flip-flop 608-1 is configured to receive the enable signal (e.g., read_ptr) from a corresponding read FIFO pointer module 520, 522. The output of the first flip-flop 608-1 is input to the second flip-flop 608-2, whose output is provided to the overflow module 606. In operation, the series of flip-flops 608-1 and 608-2 synchronize (e.g., delay) the enable signal from the read FIFO pointer modules 520, 522 with write_clock, thereby tracking the status of the read cycles. As a result, the FIFO pointer module 600 can verify that the data in a corresponding flip-flop 430 has been read before writing subsequent data to the flip-flop 430.

Figure 7:
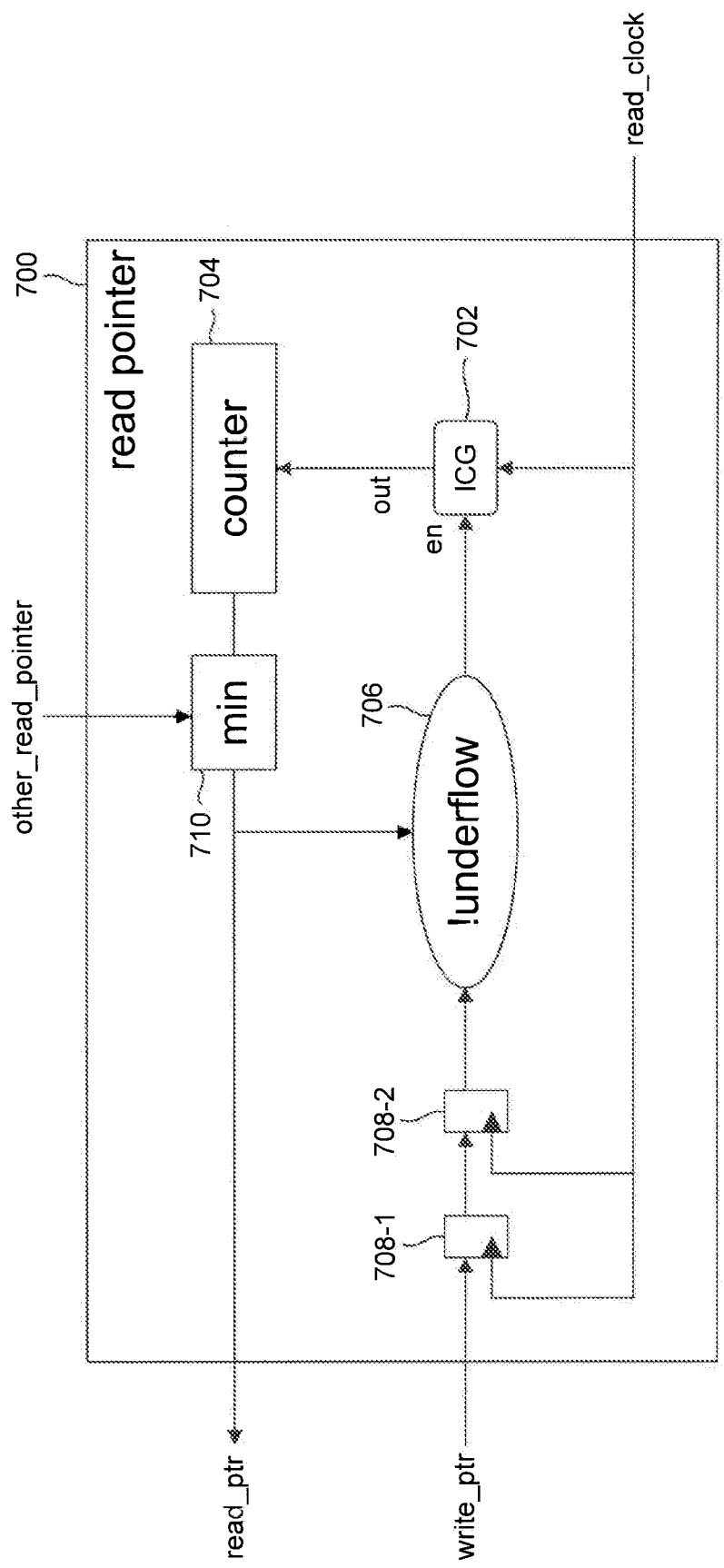
FIG. 7 illustrates a read pointer module in accordance with an exemplary embodiment of the present disclosure.

FIG. 7 illustrates a read FIFO pointer module 700 in accordance with an exemplary embodiment of the present disclosure. The read FIFO pointer module 700 can be representative of one or more of the exemplary embodiments described herein. The FIFO pointer module 700 can be implemented as read FIFO pointer module 520 and/or 522 to provide some examples. The read FIFO pointer module 700 includes an integrated clock gate (ICG) 702, counter 704, underflow module 706, flip-flops 708-1 and 708-2, and a minimum module 710. In an exemplary embodiment, read FIFO pointer module 700 implements grey code logic and are configured to perform binary-to-grey code conversion.

The integrated clock gate (ICG) 702 includes suitable logic, circuitry, and/or code that is configured to provide an input clock to the counter 704 based on an enable signal generated by the underflow module 706 and a received clock signal (e.g., clock signal received from the read clock 520). For example, the ICG 702 can be configured to generate the input clock signal based on the clock signal received from the read clock 530 as illustrated in FIG. 5.

The counter 704 includes suitable logic, circuitry, and/or code that is configured to increment a counter value based on the input clock signal generated by the ICG 702 (e.g., the counter value is incremented once for every clock cycle). The counter 704 is configured to output the incremented value as a read enable signal (e.g., read_ptr) which controls the multiplexer 510 and/or multiplexer 512 to read data from the flip-flops 430. For example, the incremented value can be outputted as the enable signal that controls the multiplexer 510 and/or multiplexer 512 to selectively read data from the flip-flops 430 as illustrated in FIG. 5.

The underflow module 706 includes suitable logic, circuitry, and/or code that is configured to determine an underflow condition based on one or more input values. For example, the underflow module 706 can determine an underflow condition based on the read enable signal generated by the counter 704 and/or minimum module 710, and the output value of the flip-flop 708-2. In an exemplary embodiment, the underflow module 706 is configured to output an enable signal when a "not underflow" condition (e.g., !underflow) is active (i.e., the enable signal is active in the absence of an underflow condition). The underflow condition is active when the output value of the minimum module 710 is greater than the output value from the flip-flop 708-2. Therefore, the underflow module 706 configured to indicate a "not overflow" condition when the underflow module 706 determines that the output value of the minimum module 710 is not greater than (e.g., less than or equal to) the output of the flip-flop 708-2.

The flip-flops 708-1 and 708-2 are configured in series, where the first flip-flop 708-1 is configured to receive the enable signal (e.g., write_ptr) from a corresponding FIFO pointer module 230, 432, and/or 434. The output of the first flip-flop 708-1 is input to the second flip-flop 708-2, whose output is provided to the underflow module 706. In operation, the series of flip-flops 708-1 and 708-2 synchronize (e.g., delay) the enable signal from the FIFO pointer modules 230, 432, and/or 434 with read_clock, thereby tracking the status of the write cycles. As a result, the read FIFO pointer module 700 can verify that the data in a corresponding flip-flop 430 has been written before reading the data from the flip-flop 430.

The minimum module 710 includes suitable logic, circuitry, and/or code that is configured to compare the output value of the counter module 704 with the value of another read FIFO pointer module (e.g., pointer modules 520, 522) of the second block 402 and output the smaller value. For example, the minimum module 710 can compare the output of the counter 704 and the value of another read FIFO pointer module within the second clock 402 and output the smaller value of the two. As a result, the value provided to the underflow module 706 will be the smaller value of the read FIFO pointer modules 520, 522 of the second block 402 so that the reading of the flip-flops 430 will be synchronized.

Figure 8:
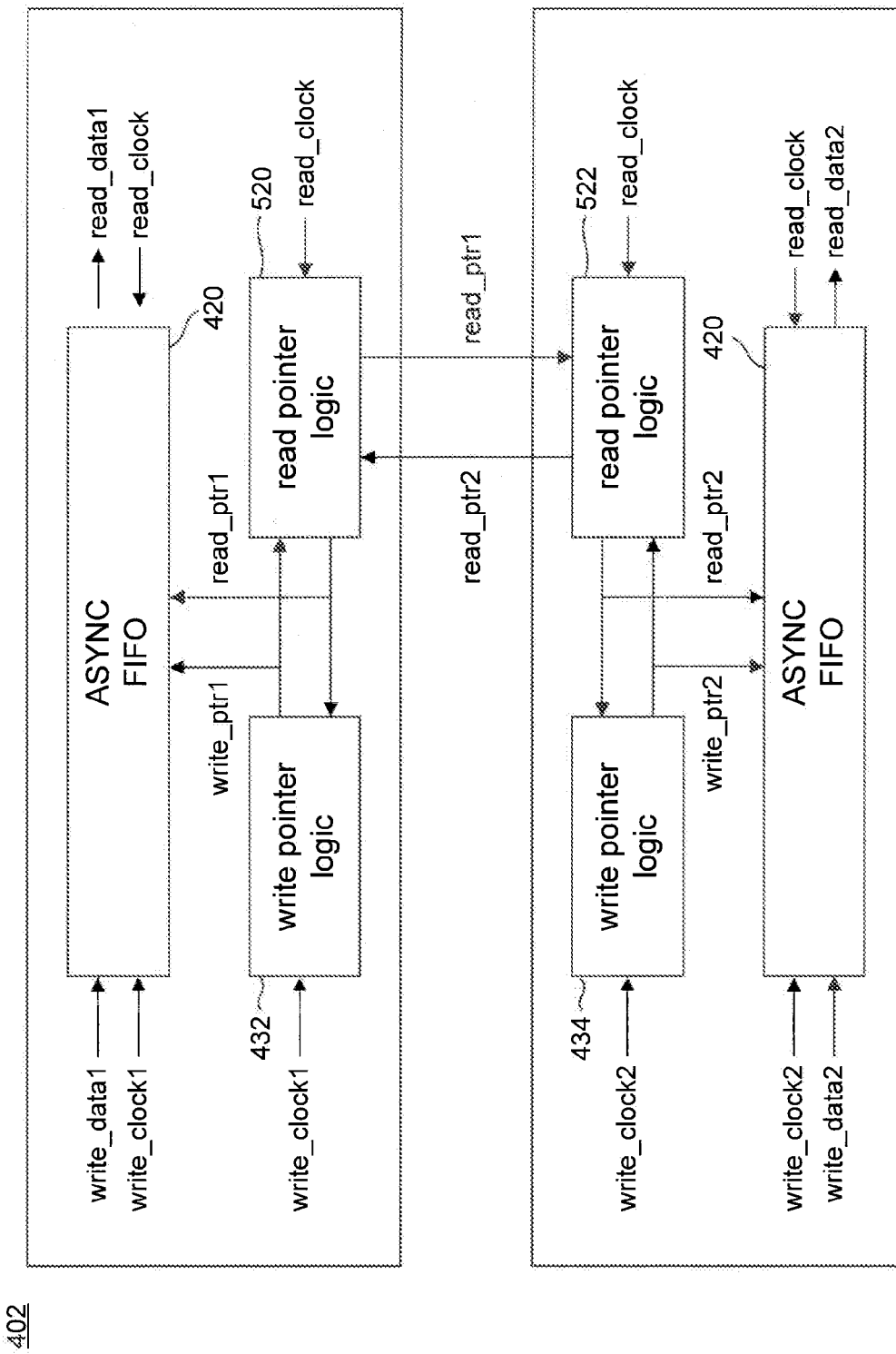
FIG. 8 illustrates an integrated circuit in accordance with an exemplary embodiment of the present disclosure.

FIG. 8 illustrates block 402 in accordance with an exemplary embodiment of the present disclosure. The block 402 includes FIFO buffer 420 split into two portions respectively connected to FIFO pointer modules 432 and 434, and respectively connected to read FIFO pointer modules 520 and 522. As illustrated in FIG. 8, the first portion of the FIFO buffer 420 receives the write enable signal (write_ptr1) and read enable signal (read_ptr1) from FIFO pointer modules 432 and read FIFO pointer modules 520, respectively. The FIFO buffer 420 also receives the clock signal (write_clock1) from the ICGs 410, data from the transmission paths 215, and the read clock (read_clock) from read clock 530. The FIFO buffer 420 outputs the read data (read_data1) via multiplexer 510 (not shown). The read FIFO pointer module 520 and FIFO pointer module 432 are configured to provide their respective pointer values to the other module (e.g., read_ptr1 is provided to 432 and write_ptr1 is provided to 520). The read FIFO pointer module 520 is also configured to provide its pointer value (read_ptr1) to the read FIFO pointer module 522 and receive the pointer value (read_ptr2) value from the read FIFO pointer module 522 so that the read pointer values of the respective read FIFO pointer modules 520 and 522 can synchronize, thereby ensuring that the flip-flops of each FIFO buffer 420 is read at the same time.

Figure 9:
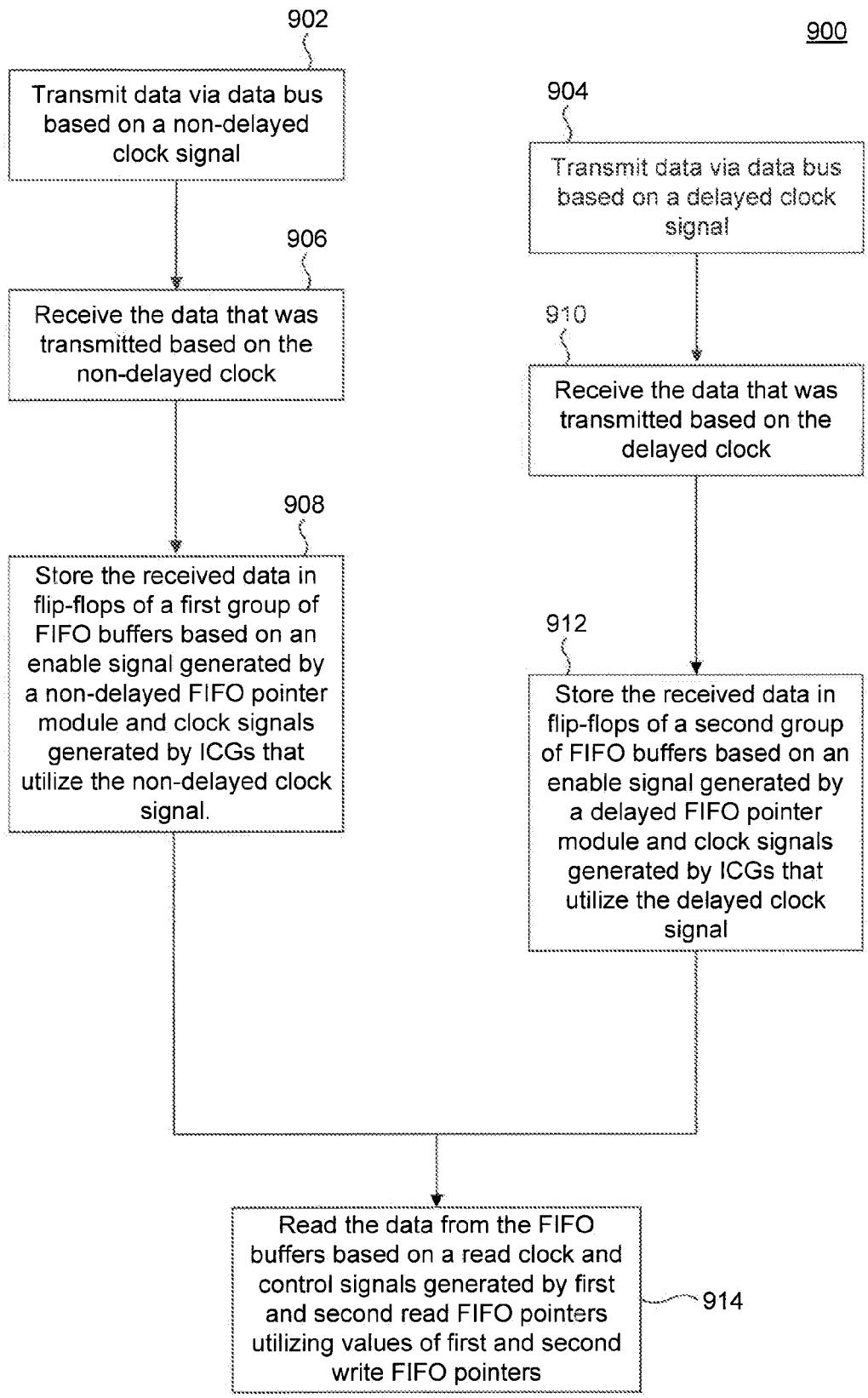
FIG. 9 illustrates a flowchart of a data transfer method in accordance with an exemplary embodiment of the present disclosure.

FIG. 9 illustrates a flowchart 900 of a data transfer method in accordance with an exemplary embodiment of the present disclosure. The method of flowchart 900 is described with continued reference to FIGS. 4-8. The steps of the method of flowchart 900 are not limited to the order described below, and the various steps may be performed in a different order. Further, the various steps may be performed sequentially, or two or more steps of the method of flowchart 900 may be performed simultaneously with each other. In an exemplary embodiment, and as illustrated in FIG. 9, steps 904, 910, and 912 are performed at times after steps 902, 906, and 908, respectively. That is, step 904 slightly trails step 902, step 910 slightly trails step 906, and step 912 slightly trails 908. Here, the "trailing" is a result of the delay introduced by delay module 450.

The method of flowchart 900 begins at step 902, where the first block 401 outputs data to the data bus 110 based on a first clock signal (e.g., Clock 1). For example, the odd flip-flops 405 (e.g., 405-1 and 405-3) output data onto transmission paths 215 of the data bus 110 based on the clock signal provided by ICG 408.

In step 904, the first block 401 outputs data to the data bus 110 based on a second clock signal (e.g., Clock 2) that is a delayed version of the clock signal Clock 1. For example, the even flip-flops 405 (e.g., 405-2 and 405-4) output data onto transmission paths 215 of the data bus 110 based on the delayed clock signal (Clock 2) provided by the delay module 450. In an exemplary embodiment, step 904 is performed at some time after step 902 has been initiated.

In step 906, the second block 402 receives data from the first block 401 via the data bus 110. Here, the data received has been transmitted by the first block 401 based on the non-delayed clock signal (e.g., Clock 1).

In step 908, the flip-flops 430 of odd FIFO buffers 420 (e.g., 420-1 and 420-3) store the received data based on clock signals generated by corresponding ICGs 410. The ICGs 410 generate the clock signals based on the non-delayed clock signal (Clock 1) provided by the ICG 408 of the first block 401 and the enable signal generated by FIFO pointer module 432. In particular, the FIFO pointer module 432 selectively activates one of the ICGs 410-1 to 410-M, which thereby activates a respective one of the flip-flops 430-1 to 430-M to store the received data.

In step 910, the second block 402 receives the delayed data from the first block 401 via the data bus 110. Here, the data received has been transmitted by the first block 401 based on the delayed clock signal (e.g., Clock 2). In an exemplary embodiment, step 910 is performed at some time after step 906 has been initiated.

In step 912, the flip-flops 430 of even FIFO buffers 420 (e.g., 420-2 and 420-4) store the received data based on clock signals generated by corresponding ICGs 410. The ICGs 410 generate the clock signals based on the delayed clock signal (Clock 2) provided by the delay module 450 of the first block 401 and the enable signal generated by FIFO pointer module 434. In particular, the FIFO pointer module 434 selectively activates one of the ICGs 412-1 to 412-M, which thereby activates a respective one of the flip-flops 430-1 to 430-M to store the received data. In an exemplary embodiment, step 912 is performed at some time after step 908 has been initiated.

In step 914, the read FIFO pointer modules 520 and 522 control multiplexers 510 and 512, respectively, to read data from flip-flops 430 of the FIFO buffers 420 based on the clock signal from read clock 530 and the value of the enable signal generated by the FIFO pointer modules 432 and 434. In particular, the read FIFO pointer modules 520, 522 monitor the value of the enable signal generated by the FIFO pointer modules 432, 434 to ensure that data has been written to a corresponding flip-flop 430 before the read FIFO pointer modules 520, 522 control the multiplexers 510, 512 to read from that particular flip-flop 430.

In an exemplary embodiment, the read FIFO pointer modules 520, 522 delay the reading from each flip-flop 430 until two subsequent flip-flops in the FIFO buffer 420 have been written to. For example, the read FIFO pointer modules 520, 522 control the multiplexers 510, 512 to read from flip-flop 430-1 of the odd FIFO buffers 420 (e.g., 420-1 and 420-3) and even FIFO buffers 420 (e.g., 420-2 and 420-4), respectively, when the FIFO pointer module 434 is allowing data to be written to flip-flop 430-3. Here, the read FIFO pointer module 522 monitors the value of the enable signal generated by the FIFO pointer module 434, which is associated with the delayed clock signal from delay module 450. That is, because the read FIFO pointer modules 520, 522 can be configured to synchronize their respective read activations, the reading of the flip-flops 430 can occur when the FIFO pointer module 434 is allowing data to be written to a predetermined subsequent flip-flop 430 as the FIFO pointer module 434 is associated with the delayed clock signal of the delay module 450.

After step 914, the flowchart may return to step 902 or may end.

Conclusion

The aforementioned description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments within the spirit and scope of the disclosure. Therefore, the specification is not meant to limit the invention. Rather, the scope of the invention is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventors, and thus, are not intended to limit the present invention and the appended claims in any way.

The present disclosure has been described above with the aid of functional building blocks illustrating the implementation of specified functions and relationships thereof The boundaries of these functional building blocks have been arbitrarily defined herein for the convenience of the description. Alternate boundaries may be defined so long as the specified functions and relationships thereof are appropriately performed.

What is claimed is:

1. An integrated circuit, comprising:
first and second write pointer modules configured to generate a first write enable signal based on a first clock signal and a second write enable signal based on a second clock signal, respectively, wherein the second clock signal is delayed by a predetermined delay with respect to the first clock signal;
a plurality of buffers comprising:
a first subset of buffers configured to store, based on the firs write enable signal, first data received via a first plurality of transmission paths of a data bus, and
a second, subset of buffers configured to store, based on the second write enable signal, second data received via a second plurality of transmissions paths of the data bus, wherein respective transmission paths in the second plurality of transmission paths are adjacent to respective transmission paths in the first plurality of transmission paths; and first and second read pointer modules configured to generate first and second read enable signals based on the first and second write enable signals, respectively, wherein the integrated circuit is configured to output the first and second data based on the first and second read enable signals, respectively.

2. The integrated circuit of claim 1, further comprising:
a plurality of multiplexers configured to receive the stored first and second data from the plurality of buffers and to selectively output the received first and second data, respectively.

3. The integrated circuit of claim 1, wherein. the first and second read pointer modules are further configured to:
monitor the other one of the first and second read pointer modules, and
synchronize the first and second read enable signals generated by the respective first and second read pointer modules based on the monitoring.

4. The integrated circuit of claim 1, wherein the first plurality of transmission paths and the second plurality of transmission paths are formed by first and second implantation processes of a multi-step implantation process, respectively, and wherein the predetermined delay is determined based on a timing variation between the first and second plurality of transmission paths resulting from the multi-step implantation process.

5. The integrated circuit of claim 1, further comprising:
an integrated clock gate configured to generate the first clock signal; and
a delay module configured to receive the first clock signal from the integrated clock gate and to generate the second clock signal based on the first clock signal, wherein the generation of the second clock signal includes delaying the first clock signal by the predetermined delay.

6. The integrated circuit of claim 4, further comprising:
a first flip-flop configured to transmit the first data to a first buffer it the first subset of buffers via the data bus based on the first clock signal; and
a second flip-flop configured to transmit the second data to a second buffer in the second subset of buffers via the data bus based on the second clock signal.

7. The integrated circuit of claim 4, wherein the first and second read pointer modules are further configured to monitor respective values of the first and second write enable signals,
wherein the first and second read enable signals are generated based on the respective monitored values of the first and second write enable signals and a predetermined offset value.

8. The integrated circuit of claim 4, wherein:
the first write pointer module includes:
a first overflow module configured to generate a first overflow signal based on the first write enable signal and the first read enable signal generated by the first read pointer module,
a first write pointer integrated clock gate configured to generate a first input clock signal based on the first clock signal and the first overflow signal, and
a first counter configured to generate the first write enable signal based on the first input clock signal; and
the second write pointer module includes:

a second overflow module configured to generate a second overflow signal based on the second write enable signal and the second read enable signal,
a second write pointer integrated clock gate configured to generate a second input clock signal based on the second overflow signal and the second clock signal, and
a second counter configured to generate the second write enable signal based on the second input clock signal.

9. The integrated circuit of claim 4, wherein the first and second read pointer modules each include:
an underflow module configured to generate an underflow signal based on a respective one of the first and second write enable signals and a read enable signal;
a read pointer integrated clock gate configured to generate an input clock signal based on the underflow signal;
a counter configured to generate a counter value based on the input clock signal; and
a minimum module configured to:
receive another read enable signal generated by the other one of the first and second read pointer modules and the counter value, and
generate the read enable signal based on the counter value and the other read enable signal.

10. A method for communicating data within an integrated circuit utilizing a data bus, the method comprising:
transmitting first data along a first plurality of transmission paths of the data bus based on a first clock signal;
generating a second clock signal by delaying the first clock signal by a predetermined delay value;
transmitting second data along a second plurality of transmission paths of the data bus based on the second clock signal, wherein respective transmission paths in the second plurality of transmission paths are adjacent to respective transmission paths in the first plurality of transmission paths;
receiving and storing the transmitted first data based on a first write enable signal generated based on the first clock signal; and
receiving and storing the transmitted second data based on a second write enable signal generated based on the second clock signal.

11. The method of claim 10, further comprising:
retrieving and selectively outputting the stored first data based on a first read enable signal; and
retrieving and selectively outputting the stored second data based on a second read enable signal, wherein the first and second read enable signals are generated based on the first and second write enable signals, respectively.

12. The method of claim 11, wherein the generation of the first and second read enable signals includes offsetting the first and second read enable signals with respect to corresponding first and second write enable signals.

13. The method of claim 11, wherein the generation of the first and second write enable signals includes monitoring values of the first and second read enable signals, and wherein the first and second write enable signals are generated based on the respective monitored values of the first and second read enable signals.

14. The method of claim 11, wherein the generation of the first and second read enable signals includes monitoring the other one of the first and second read enable signals and synchronizing the first and second read enable signals.

15. The method of claim 14, further comprising:
monitoring values of the first and second write enable signals, wherein the first and second read enable signals are generated based on the respective monitored values of the first and second write enable signals and a predetermined offset value.

16. An integrated circuit, comprising:
a first component block that includes:
   a first flip-flops,
   a second plurality of flip-flops, and
   a delay module configured to provide a delay signal to the second plurality of flip-flops to delay the activation of the second plurality of flip-flops; and
a second component block that includes:
   a first plurality of buffers configured to store first data received via a first plurality of transmission paths of a data bus,
   a second plurality of buffers configured to store second data received via a second plurality of transmission paths of the data bus, wherein respective transmission paths in the second plurality of transmission paths are adjacent to respective transmission paths in the first plurality of transmission paths,
   first and second write pointer modules configured to provide first and second write enable signals to the first and second plurality of buffers to control write access to the first and second plurality of buffers, respectively, wherein the controlling of the write access to the second plurality of buffers is based on the delay signal,
   first and second multiplexers configured to receive the first and second data from the first and second plurality of buffers, respectively, and
   first and second read pointer modules configured to provide first and second read enable signals to the first and second multiplexers to selectively output the first and second data received from the first and second plurality of buffers, respectively, wherein the first and second read enable signals are generated based on the first and second write enable signals, respectively,
wherein the data bus is configured to communicatively couple the first and second plurality of flip-flops to the first and second plurality of buffers, respectively.

17. The integrated circuit of claim 16, wherein the first and second read pointer modules are cm figured to generated the respective first and second read enable signals by offsetting respective values of the first and second write enable signals by a predetermined offset value.

18. The integrated circuit of claim 1, wherein the predetermined delay is determined based on respective timing offsets introduced by the first plurality of transmission paths and the second plurality of transmission paths.

19. The integrated circuit of claim 1, wherein the predetermined delay is determined such that the second clock signal eliminates crosstalk between the respective first and second transmission paths.

20. The method of claim 10, further comprising:
determining a difference in properties between a first transmission path in the first plurality of transmission paths and a second transmission path in the second plurality of transmission paths; and
determining the predetermined delay value based on the determined difference in properties.

* * * * *

UNITED STATES PATENT AND TRADEMARK OFFICE
CERTIFICATE OF CORRECTION

Page 1 of 1

PATENT NO. : 9,170,769 B2
APPLICATION NO. : 14/027068
DATED : October 27, 2015
INVENTOR(S) : Mirchandani et al.

It is certified that error appears in the above-identified patent and that said Letters Patent is hereby corrected as shown below:

IN THE CLAIMS

Column 15, line 17, please replace "wherein. the" with --wherein the--.

Column 15, line 43, please replace "buffer it the" with --buffer in the--.

Column 17, line 6, please replace "a first flip-flops" with --a first plurality of flip-flops--.

Signed and Sealed this
Twenty-ninth Day of March, 2016

Michelle K. Lee
*Director of the United States Patent and Trademark Office*